United States Patent [19]
Okada et al.

[11] 3,947,953
[45] Apr. 6, 1976

[54] METHOD OF MAKING PLASTIC SEALED CAVITY MOLDED TYPE SEMI-CONDUCTOR DEVICES

[75] Inventors: Takeshi Okada; Sanenobu Sonoda; Katsumi Yamamoto; Masahiro Fujimori, all of Ibaragi, Japan

[73] Assignee: Nitto Electric Industrial Co., Ltd., Ibaragi, Japan

[22] Filed: Aug. 23, 1974

[21] Appl. No.: 499,947

[52] U.S. Cl. .................. 29/588; 29/590; 264/265; 264/272; 357/67; 357/72; 156/153; 156/242
[51] Int. Cl.² .................. H01L 21/304; B29C 6/02
[58] Field of Search ....... 264/272, 265; 174/DIG. 3; 51/131, 283; 29/576 S, 590, 588

[56] References Cited
UNITED STATES PATENTS

| | | | |
|---|---|---|---|
| 2,955,031 | 10/1960 | Bliton et al. | 51/283 |
| 3,504,457 | 4/1970 | Jacobsen et al. | 51/131 |
| 3,676,748 | 7/1972 | Kobayashi et al. | 174/DIG. 3 |
| 3,693,252 | 9/1972 | Robertson et al. | 264/272 |
| 3,706,840 | 12/1972 | Moyle | 264/272 |
| 3,767,839 | 10/1973 | Beal | 174/DIG. 3 |

OTHER PUBLICATIONS

"Liquid Honing", Vapor Blast Manufacturing Company, Milwaukee, Wisc., copyright 1946, 8 pages.

*Primary Examiner*—Robert F. White
*Assistant Examiner*—James B. Lowe
*Attorney, Agent, or Firm*—Sughrue, Rothwell, Mion, Zinn & Macpeak

[57] ABSTRACT

The external lead frame for a plastic sealed, cavity molded type semi-conductor device is formed of Phospor bronze, with the bronze lead frame liquid honed, it is pre-heated and supported in a mold cavity so as to be embedded into a powder epoxy resin molded header with improved sealing between the Phospor bronze lead frame in the header molded thereabove.

3 Claims, 3 Drawing Figures

METHOD OF MAKING PLASTIC SEALED CAVITY MOLDED TYPE SEMI-CONDUCTOR DEVICES

BACKGROUND OF THE INVENTION

1. Field of the Invention

This invention relates to a method of making a semi-conductor device whether in elements or integrated circuit form and wherein, the semi-conductor element or elements are completely protected from the external atomsphere.

2. Description of the Prior Art

In order to protect a semi-conductor element from the external atmosphere, it has been proposed that the semi-conductor element be directly buried or embedded within a molding material during fabrication of the semi-conductor device. In this case, however, since thermal expansion coefficients of the molding material and the semi-conductor element are different, a stress may be applied to the semi-conductor element and the resultant strength given thereto due to the change of temperature when the semi-conductor element is molded or during operation of the semi-conductor device after molding. As a result, the semi-conductor element may often be damaged or the lead wires of the semi-conductor device internally of the molded body may be disconnected from the external lead extending inwardly thereof, or the internal lead may be broken.

To eliminate these disadvantages, a plastic sealed split casing, cavity type molded semi-conductor device has recently been developed which avoids the direct molding of the semi-conductor element by embedding the semi-conductor element with the package header.

Two examples of conventional cavity molded type semi-conductor devices are shown in FIGS. 1 and 2. The description of the first semi-conductor device of FIG. 1 is described in conjunction with its method of fabrication. A semi-conductor element 2 is mounted on a header 1 previously formed or molded of plastic insulating material, the semi-conductor element 2 being positioned within the central cavity 8 within the header 1. An external lead frame formed of copper, Kovar or the like comprising external leads 3 and 3' is mounted on the header 1 by means of a plastic system binder 4. Thereafter, the internal lead wires 5 and 5' which may be formed of aluminum, gold or the like are bonded to the semi-conductor element 2 and to the inner ends of the external leads 3 and 3' respectively. Finally, a plastic cap 7 having a hollow or recessed portion 6 defining an upper cavity is mounted on the header 1 through a plastic system binder 8 to seal the semi-conductor element 2 from the atmosphere and pressure application to the plastic system binders 4 and 8. The confronting surface port of the header 1 and the cap 7 are thus plastically sealed as are the external leads 3 and 3' which extend through the sealed area from the internal cavity to the ambient atmosphere.

With respect to the second type of cavity molded semi-conductor device as shown in FIG. 2, with respect to its method of manufacture, a semi-conductor element 2 is mounted on a header 11 with a caviity 19, the header in this case being molded with the external leads 3 and 3' of the lead frame being embedded within the header 11 during molding, the header 11 being molded by conventional molding processes using a molder material of powdered epoxy resin. Thereafter, the internal lead wires 5 and 5' are bonded to the semi-conductor element 2 and the external leads 3 and 3' of the lead frame, respectively. Finally, an insulative cap 17 is mounted to the header 11 overlying cavity 10 by way of an epoxy resin binder 14 under the application of heat and pressure.

However, since the cavity molded type semi-conductor devices thus obtained have poor adherence between the external lead frame, the binder and the molding material forming the header and the cap relative to one another, it is difficult to assure that the semi-conductor element or elements within the internal cavity are protected from the external atmosphere. For this reason, such fabricating processes are not generally employed.

SUMMARY OF THE INVENTION

To the contrary, the present invention as a result of various experiments has determined, that if an external lead frame is made of phospor bronze and is employed in the fabrication process of a plastic sealed, cavity molded semi-conductor device, the semi-conductor device can be highly protected from the external atmosphere which novel and excellent effect is highly unexpected. The present invention results from this discovery. Further, with respect to the present invention, it has been determined that if the phospor bronze lead frame is previously liquid honed, the plastic sealed cavity molded semi-conductor is provided with additionally improved airtight sealing properties. It has been determined, that it is preferable to employ as a liquid honing material a mixture of water and artificial emery abrasive material of 5 to 80 $\mu$ grain size which are mixed in the ratio of 2 parts water to 0.5 to 1 part abrasive material, by volume.

DESCRIPTION OF THE PREFERRED EMBODIMENT

The present invention will now be described with respect to particular examples and by way of reference to FIG. 3.

EXAMPLE 1

A Phosphor bronze lead frame A of given size and as an example, being 250 microns in thickness and 500 microns in width and having 24 external leads, is preheated to 80°C. by means of a high frequency preheater of conventional type. The composition of the phospor bronze may vary between the following limits: Phosphor 0.03–0.4%; Tin 1–10%; Copper 89.6–98.97% with the preferred composition being Phorphor 0.23%; Tin 8.0% and Copper 91.77%. The pre-heated Phosphor bronze lead frame is embedded by means of a transfer molding machine under conditions of 150°C. temperature, 70 Kg/cm$^2$ pressure and 10 mm/sec plunger injection rate within a molded material consisting of powdery epoxy resin, the molding material being supplied by Nitto Electric Industrial Co., Ltd. of Japan, the molded heater D being formed thereby having the dimensions illustrated in FIG. 3 and being formed such that the outer end of the external leads of the lead frame extend beyond the sides of the header to permit them to be socketed. In the molding process, a cavity E is provided within the upper face of the same, preferably at the center in order to receive the semi-conductor element, and a platform F is provided in the form of recessed surface portion on the upper face of the header to permit a cap such as cap 17 in the structure of FIG. 2 to be sealably mounted thereon. Further, the lead frame A is molded into the header in such a manner that the semi-conductor element may be placed in a cavity of the lead frame and the inner ends of the external leads of the lead frame are exposed so that the semi-conductor and those portions of the leads may be wire bonded by way of internal lead connection similar to leads 5 and ' in the structure of FIG. 2.

Figure 1:
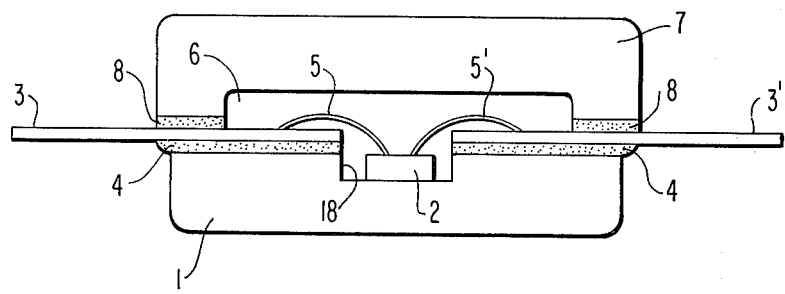
FIG. 1 is a sectional view of a conventional cavity molded type semi-conductive device to which the present invention has application.
Figure 2:
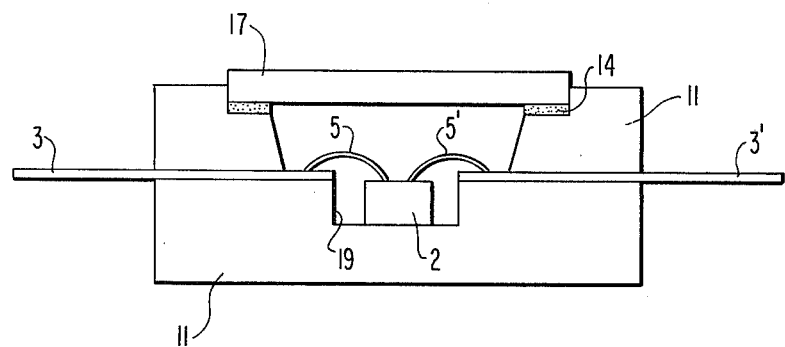
FIG. 2 is a sectional view of another conventional cavity molded type semi-conductive device to which the present invention has application.

Thereafter, the internal exposed portion of the lead frame A exposed within the cavity E and the surfaces of the platform F to mount a cap such as cap 17 of FIG. 2 are liquid honed. The liquid honing treatment is carried out by treating the surfaces to the abrasive solution at a pressure of 3 Kg/cm$^2$ at a flow rate of abrasive solution of 1 sec/cm$^2$ by means of a liquid honing apparatus such as that manufactured and sold by Suji-Seiki Co., Ltd. of Japan, using an abrasive solution consisting of water and aluminum oxide (20–30 microns grain size) with a mixture of 2 parts water and 1 part abrasive material, by volume. The liquid honing treatment results in the removal of contaminants such as powdery dust, on the lead frame which is exposed within the cavity and results in increased adherence being obtained between the platform F and the cap to be applied thereto.

The portion of the lead frame exposed within the cavity is then gold-plated by partial plating methods which are conventional to obtain a lead frame molding. The lead frame molding thus obtained is shown at G in FIG. 3. In FIG. 3, the phospor bronze lead frame A is provided with a lead frame portion B buried within the molding material defining the header D while the portion of the lead frame extending externally of the molded header D and consisting of the external leads, is shown at C. These leads may be socketed. The epoxy resin molded header D is molded so as to provide cavity E for receiving the semi-conductor elements such as element (2) of FIG. 2 and a platform defined by surface F to each side of cavity E for binding and mounting the cap such as cap 17, in FIG. 2 thereon. The molder header is 31.7 millimeters in length, 13.5 millimeters in width and 3.95 millimeters in thickness. The cap to be mounted on the platform is preferably 16.2 millimeters in length, 13.5 millimeters in width and 1.0 millimeters in thickness. The semi-conductor element such as element 2 of FIG. 2 to be hermetically sealed therein is sealed by binding and mounting the cap on the platform by way of a heat and pressure sensitive adhesive (not shown) between platform F and the cap. The characteristic test of the lead frame formed in accordance with Example 1 and as shown in FIG. 3 is illustrated in the first column of Table 1 identified as Example 1.

EXAMPLE 2

Figure 3:
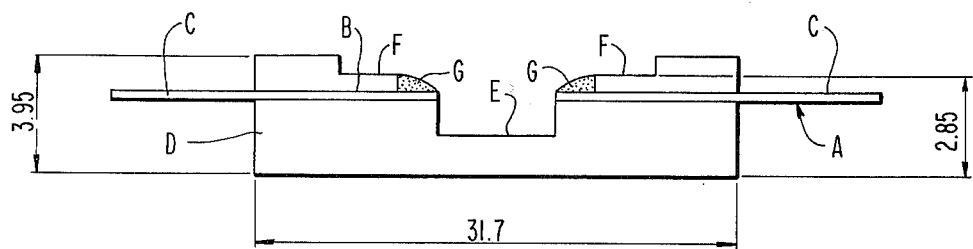
FIG. 3 is a sectional view of a molded header incorporating the improved lead frame of the present invention, which may advantageously form a part of the cavity molded type semi-conductor device of FIGS. 1 and 2.

Example 2 is essentially similar to Example 1 except for some changes which are described herein, but by way of reference to FIG. 3, the portion of the lead frame indicated at B which is embedded within the molded plastic header 11 is previously treated to a liquid honing treatment prior to molding of the header D and in all other respects, the plastic sealed cavity molded type semi-conductor device is formed identically to the method as described in Example 1. The liquid honing pre-treatment of the portion B of the phospor bronze lead frame involves the blasting of that portion of the lead frame by a liquid stream at a flow rate of 1 sec/cm$^2$ of an abrasive solution consisting of water and aluminum oxide (20–30 microns grain size) at a mixture ratio of 2 parts water to 1 part abrasive material by volume. The surface roughness of the lead frame portion B which is liquid honed is 4–6 microns in Rz value defined by JIS B 0601.

COMPARATIVE EXAMPLE

As a comparative example instead of employing a phospor bronze lead frame as used in Example 1 and Example 2, a lead frame formed of Kovar of 250 microns thickness and 500 microns width and having 24 leads and in general similar to the lead frame of Example 1 is employed in its stead and the method of construction of the semi-conductor device in all other respects follows the Example 1. The results of the characteristic test of the comparative example, the Example 2 and Example 1 are shown in Table 1 below.

Table 1

| Characteristic value | Example 1 | Example 2 | Comparative Example |
|---|---|---|---|
| Initial Value | 0/50 | 0/50 | 1/50 |
| Thermal test (6 cycles) | 1/50 | 0/50 | 17/50 |
| P.C.C.T. (5 cycles) | 1/50 | 0/50 | 18/50 |
| P.C.C.T. (10 cycles) | 1/50 | 0/50 | 23/50 |
| P.C.C.T. (20 cycles) | 2/50 | 0/50 | 33/50 |

The characteristic tests of Table 1 constitute helium leakage tests according to MIL STD 883 Method 1014 conducted to determine the airtight sealing properties of the lead frame and the molded header 11 carrying the same. In Table 1, the initial value represents a result of helium leaking test of the lead frame molding just after fabrication thereof. The thermal test after six cycles represents the result of the helium leakage test after one thermal cycle wherein the lead frame moldings are cooled in air at −65°C. for 20 minutes and then heated in air to 150°C. for 20 minutes which heating and cooling is repeated in sequence 6 times.

The P.C.C.T. tests are pressure cooker cycle tests, one cycle of which involves the lead frame molding being placed in water vapor (under a pressure of given magnitude) at 125°C. for 30 minutes and them immersed in water at room temperature for an additional 30 minutes. In Table 1 the helium leakage tests are then carried out after five, 10 and 20 cycles of P.C.C.T. respectively. The lead frame moldings employed in the P.C.C.T. tests are first subjected to the thermal test of six cycles.

Each value in Table 1 represents an accumulative substandard rate in which the denominator indicates the total number of lead frame moldings used in the helium leakage tests and the numerator indicates the number of substandard moldings as a result of those tests. Under the helium leakage tests, the lead frame moldings were indicated as substandard if a leak of more than $10^{-7}$ Torr/Sec occurred. It is generally known in the industry that semi-conductor devices having leaks in excess of $10^{-7}$ Torr/sec. are substandard.

As will be apparent from the experimental results, semi-conductor devices with excellent airtight sealing properties may be obtained when, the external lead frames which are molded into the header are formed of phospor bronze and such airtight sealing properties can be further enhanced if those portions of the external lead frames which are embedded within the header are treated to a liquid honing treatment prior to molding. The seal of the external lead frame to the header by way of a molded embedding of those lead frame portions results in greater protection of the semi-conductor element carried thereby from the atmosphere.

What is claimed is:

1. In a method of making a plastic sealed cavity molded type semi-conductor device wherein a molded plastic header having an external lead frame molded therein is provided with an internal cavity housing the semi-conductor element which is electrically connected to the internal end of the external leads by way of internal lead wires within the cavity and wherein a cap is heat and pressure sealed to the header to seal the cavity from ambient atmosphere, the improvement comprising the steps of:

a. forming the external lead frame from a metal having a composition of Copper (89.6–98.97%), Phosphor (0.03–0.4%) and Tin (1–10%);

b. heating the external lead frame to 80°C prior to embedding it in the header;

c. molding said header by injection molding an epoxy resin powder at a temperature of 150°C, a pressure of 70kg/cm$^2$ and a plunger injection rate of 10 mm/sec such that said external lead frame is embedded therein and internal ends thereof protrude into the cavity; and d. honing the internal ends of the external lead frame by subjecting the surfaces to a liquid stream of water and aluminum oxide of 20 to 30 micron grain size in a mixture ratio of 2 parts water to 1 part abrasive material by volume at a flow rate of 1 sec/cm$^2$ and under 3kg/cm$^2$ pressure.

2. The method of claim 1 comprising the addditional step of honing the portion of the lead frame to be embedded in the header by subjecting the portion to a liquid stream of water and aluminum oxide of 20 to 30 microns grain size in a mixture ratio of 2 parts water to 1 part abrasive material by volume, before molding the header around the lead frame.

3. The method of claim 1 wherein the metal for the lead frame is composed of 91.77% Copper, 8.0% Tin and 0.23% Phosphor.

* * * * *